(12) United States Patent
Dobson

(10) Patent No.: US 6,169,027 B1
(45) Date of Patent: *Jan. 2, 2001

(54) METHOD OF REMOVING SURFACE OXIDES FOUND ON A TITANIUM OXYNITRIDE LAYER USING A NITROGEN CONTAINING PLASMA

(75) Inventor: Christopher David Dobson, Bristol (GB)

(73) Assignee: Trikon Equipments Limited, Newport (GB)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/975,449

(22) Filed: Nov. 21, 1997

(30) Foreign Application Priority Data

Nov. 22, 1996 (GB) ................................... 9624343
Feb. 6, 1997 (GB) ................................... 9702410

(51) Int. Cl.⁷ ........................................ H01L 21/44
(52) U.S. Cl. ................... 438/653; 438/654; 438/656; 438/658
(58) Field of Search ..................... 438/660, 915, 438/775, 658, 922, 627, 628, 643, 644, 648, 653, 654, 656

(56) References Cited

U.S. PATENT DOCUMENTS

| | | | |
|---|---|---|---|
| 4,701,349 | * 10/1987 | Koyanagi et al. | 427/228 |
| 4,884,123 | * 11/1989 | Dixit et al. | 357/71 |
| 5,136,362 | 8/1992 | Grief et al. | |
| 5,202,152 | * 4/1993 | Giannelis et al. | 427/108 |
| 5,290,731 | 3/1994 | Sugano et al. | |
| 5,378,660 | 1/1995 | Ngan et al. | 438/656 |
| 5,395,461 | 3/1995 | Taki et al. | 148/208 |
| 5,419,787 | 5/1995 | Levi. | |
| 5,449,954 | * 9/1995 | Ito | 257/751 |
| 5,504,043 | * 4/1996 | Ngan et al. | 438/247 |
| 5,514,908 | * 5/1996 | Liao et al. | 257/751 |
| 5,567,483 | 10/1996 | Foster et al. | 427/248.1 |

(List continued on next page.)

FOREIGN PATENT DOCUMENTS

| | | |
|---|---|---|
| 0 337 725 A2 | 10/1989 | (EP). |
| 0 516 344 A1 | 12/1992 | (EP). |
| 0 680 077 A1 | 12/1994 | (EP). |
| 0 738 002 A2 | 10/1996 | (EP). |
| 747 500 A1 | 12/1996 | (EP). |
| 2 207 809 | 2/1989 | (GB). |
| 2 207 809 | 8/1989 | (GB). |
| WO 96/02938 | 2/1996 | (WO). |
| WO 96/02939 | 2/1996 | (WO). |

OTHER PUBLICATIONS

Co–Pending Application No. 08/975705, filed Nov. 21, 1997, Christopher Dobson.

* cited by examiner

*Primary Examiner*—Wael Fahmy
*Assistant Examiner*—Kurt Eaton
(74) *Attorney, Agent, or Firm*—Jones Volentine, LLP

(57) ABSTRACT

The invention consists in a method of filling recesses in a surface layer of a workpiece with conductive material including the steps of:

forming a barrier layer on the surface;

depositing a layer of conductive material on to the barrier layer;

and forcing, flowing or drifting the conductive material into the recesses characterized in that the barrier layer includes Oxygen or is oxidized and oxidized material in the surface of the layer is nitrided prior to the deposition of the conductive material.

23 Claims, 7 Drawing Sheets

U.S. PATENT DOCUMENTS

| | | | |
|---|---|---|---|
| 5,593,511 | 1/1997 | Foster et al. | 148/237 |
| 5,703,403 * | 12/1997 | Sobue et al. | 257/751 |
| 5,719,446 * | 2/1998 | Taguchi et al. | 257/751 |
| 5,723,367 * | 3/1998 | Wada et al. | 438/248 |
| 5,739,573 * | 4/1998 | Kawaguchi | 257/384 |
| 5,843,843 * | 12/1998 | Lee et al. | 438/688 |
| 5,851,364 * | 12/1998 | Fu et al. | 204/192.3 |
| 5,858,184 | 1/1999 | Fu et al. | 204/192.17 |
| 5,985,759 * | 11/1999 | Kim et al. | 438/653 |

METHOD OF REMOVING SURFACE OXIDES FOUND ON A TITANIUM OXYNITRIDE LAYER USING A NITROGEN CONTAINING PLASMA

BACKGROUND OF THE INVENTION

1. Field of the Invention

This invention relates to methods and apparatus for treating a workpiece, such as a semiconductor wafer and, in particular but not exclusively, to methods and apparatus for providing a layer where there are recesses on the surface of the workpiece.

2. Description of the Related Art

There are a number of situations during the formation of a semiconductor device in a semiconductor wafer where it is necessary to deposit a layer onto the wafer. One such situation arises when conductive or semiconductive tracks are formed over the wafer, so that those tracks may make contact with active regions of the device or circuit. Normally, such tracks must then extend through an insulating layer on the surface of the wafer so as to make contact with active regions below that insulating layer, or with further conductive tracks below that insulating layer (when the holes are usually called "vias"). Where the track extends through a hole in this way, it is important that the amount of material e.g. metal filling that hole is sufficient to ensure good electrical contact.

Another situation is when an electrically insulating layer is to be formed over the wafer, in order to isolate active regions and/or conductive tracks from each other, or to form a protective covering known as a passivation layer. Such a layer is often required to cover conductive tracks or other structure on the wafer, and these structures may be close to each other so that the gaps between them form narrow trenches. It is important that the insulating material covers all the surface with sufficient thickness to provide good electrical insulation, and that the top surface of the insulating layer shall be sufficiently smooth for the next stage of wafer processing.

The normal way of forming layers on the surface of a semiconductor wafer, is by the use of a deposition technique, such as sputtering for conductive layers, or chemical vapor deposition for insulating layers. In such a technique, the surface on which the layer to be formed is bombarded with particles of the material to be deposited until a layer of a suitable thickness has been achieved.

Where that surface is the surface of a layer with a hole or trench therein extending ot the surface of the wafer, the particles of the material are deposited on the sides and base of the hole or trench, but it has been found that there is a tendency for the particles to be deposited primarily at the mouth of the hole or trench, so that the width of the mouth is reduced as the deposition continues. The effect of this is that the interior of the hole or trench may suffer from shadowing, and a suitably thick layer of the materia may not be deposited inside the hole before deposition at the mouth of the hole or trench effectively closes the hole or trench and prevents further deposition therein, or before the required thickness has already been deposited elsewhere on the surface. This problem become increasingly significant as the width of the structure decreases, and developments in semi-conductor technology have resulted in moves towards smaller and narrower structures.

An alternative method of producing a suitable conductive layer is firstly to fill the hole with one metal, and then form the metal layer over the insulation and the filled hole. Thus, the hole may be filled with tungsten using a technique such as chemical vapor deposition, and then a more common metal, such as aluminum or aluminum alloy may be deposited over the surface by the sputtering technique discussed above. However, the gaseous sources for the materials used to fill the holes by chemical vapor deposition are expensive, and a two-stage process involving different material is necessary, increasing the cost of the whole device.

Holes can be filled by sputtering a high temperature (>500° C.) and/or using bias sputtering, but the quality of the metal is degraded, and the process is inconsistent and hard to control. Aluminum CVD is possible and does fill holes, but the process is slow, hard to control, and requires previous deposition of a suitable seed layer. Again, a two-stage process involving different materials is then necessary.

There are alternative methods of producing a suitable insulating layer. One method is to deposit part of the required thickness by chemical vapor deposition (CVD), and then to remove the parts of the layer that overhang the trench by sputter etching or reactive ion etching. This cycle may be repeated until sufficient thickness has been deposited, the etching steps being used to prevent the closing of the mouth of the trench. However the process is slow, requires several steps, and must be adjusted for different geometries.

Another method is to deposit an insulating material that can be reflowed by melting, such as silicon oxide doped with boron or phosphorous. The material may be deposited by CVD, and then heated until it flows into the trench. However the temperature required for reflow of such material is greater than 800° C., which will cause melting of any aluminum tracks present, and can cause undesirable diffusion in active regions of devices in the water.

A third method is to apply a liquid solution onto the surface of the wafer, where such liquid when subsequently heated forms a solid insulating layer, such as that known as "spin-on-glass". The material flows into the trenches when first applied. However, the material tends to retain some moisture after the heating process, and this moisture can cause device unreliability due to corrosion. It may require a capping layer to seal against moisture, which increases the number of process steps and hence the device costs.

Our earlier co-pending European Patent Application No. 92304633.8 (EP '633) therefore proposes that a layer be formed on the surface of an article, in which surface there is a recess such as a hole or trench, the sides and base of which are to be provided with a covering so as, e.g. in a wafer, to provide electrical contact or insulation. Then, the article, including the layer is subjected to elevated pressure and elevated temperature sufficient to cause the layer to deform.

It is thought that the primary factor causing the deformation is plastic flow by dislocation slips, which is activated by the elevated pressure and temperature. Surface diffusion grain boundary diffusion and lattice diffusion may also have an effect, activated by the elevated temperature.

The precise temperature and pressure conditions necessary to achieve the deformation of the layer will depend on the materials used but, for aluminum or aluminum alloys, temperatures in excess of 350° C. and pressures in excess of $20 \times 10^6$ Pa (3,000 p.s.i.) Have been found to be suitable, but lower temperature and/or pressure may also be effective. Alloys commonly used for forming conductive tracks are of composition Al/0-2% Si/0-4% Cu/0-2% Ti, and these have been found to deform suitably under such conditions.

The EP '633 invention is not limited to one particular method of forming the layer, and sputtering or chemical vapor deposition techniques may be used as discussed above, although other alternatives such as vacuum evaporation or application of a liquid may also be used. Indeed, it is possible for the layer to be pre-formed, as a film, which film is then positioned on the article.

Thus, to form a conductive, insulating or semiconductive layer on a semiconductor wafer, which layer is to extend through holes or trenches in an underlying layer on the surface of the wafer, material for forming the layer (e.g. aluminum or other suitable material) is first deposited on the surface of the underlying layer by e.g. sputtering. The material may then be deposited on the sides and base of the hole or trench, although the thickness at the mouth of the structure will be greater. When a suitable amount of material has been deposited deposition stops and the result is subject to elevated temperatures and pressures for a period sufficiently to allow a reliable electrical contact if the material is a metal, or to provide a reliable electrical insulation if the material is an insulator.

It is important that the mouth of the structure is completely closed by the deposition, leaving a void below the closed mouth within the structure. Such closing of the mouth of the structures enables the material to be pushed down into the structure, collapsing the void by the elevated pressure and temperature conditions. Thus, unlike the prior art arrangements, the closing of the mouth of the structure does not represent a limit to the amount of the material that may, at the end of the procedure, fill the structure to achieve a satisfactory contact or insulator.

Aluminum, or some aluminum alloys, are particularly suitable for use with the EP '633 invention because their yield strengths decrease gradually with temperature. Thus, they will deform to move into or fill the hole at temperatures significantly below their melting point. For other materials, since it is often desirable to avoid very high temperatures, it may be difficult to ensure that suitable deformation occurs below the melting point.

However, it may still be possible to achieve this with suitably precise temperature control.

If aluminum is used, temperatures in the range 350° C. to 650° C. and pressures in excess of 3,000 p.s.i. have been found suitable. Indeed, it is believed that the pressures may be as high as $350 \times 10^6$ (50,000 p.s.i.) or even higher enabling the use of temperatures less than 350° C. The duration of such pressure and temperature condition is also not thought to be critical, and inert or reactive gases may be used to create the high pressure.

It has previously been mentioned that it is important for the mouth of the structure to be completely closed by the deposition, leaving a void below the closed mouth. If the deposition is vertical, or substantially vertical, it has been found that such closing of the mouth requires a long deposition of a thickness at least as great as the width of the hole. It may be desirable to reduce this thickness, so that after subsequent pattern etching of the layer, the step heights are reduced, to ease (for example) subsequent layer step coverage, or photolithography (by reducing the depth of focus field required). Therefore, in a further development of the EP '633 invention, it is proposed that the deposition be carried out by magnetron sputtering, such that the flux of material is from a large range of angles to the surface of the wafer, and that the wafer be heated to increase the mobility of the deposited material. Under the correct surface and heat conditions, the material deposited in the hole or trench can flow out of that hole or trench and contribute to the bridging. For magnetron sputter deposition of aluminum alloys, a platen temperature of 350–450° C. has been found to be suitable, but other temperatures may also enhance the bridging effect.

In both the fields of micro engineering and the formation of semiconductor devices, it is becoming increasingly necessary to be able to fill recesses having high aspect ratios, particularly in order to form conductive paths between parts of the devices. In the field of semiconductor devices in particular, there is an increasing need to be able to fill such recesses when they are arrayed very close together and/or in high densities.

As described above, EP '633 describes a method of filling such recesses which comprises the steps of depositing layer of material on to the exposed surface of a workpiece having a multiplicity of recesses until all the recesses are bridged and then applying elevated temperatures and pressures to the layer so that the layer is deformed, without melting, to fill the respective recesses. In general, this process has been extremely successful in dealing with the problem of high aspect ratio recesses, but difficulties have been experienced, when there is a high density of recesses or when the grain structure of the deposited layer is such that localized shearing takes places as the material moves down in the recess.

From one aspect, the invention described in our earlier co-pending British Patent Application No. 9619461.8 (GB '461) consists in a method of processing a workpiece having a multiplicity of recesses formed in an exposed surface, the material comprising depositing a first layer of material on the exposed surface over all the recesses to close the openings, depositing a second layer on top of the first and applying heat and pressure to the layers such that the first layer is urged into the recesses to fill them.

From another aspect, the GB 461 invention consists in a method of processing a workpiece having a multiplicity of recesses formed in an exposed surface, the method comprising depositing a first layer of material on the exposed surface until the first layer extends over all the recesses to close completely the openings of all the recesses in the exposed surface and subjecting the wafer and the first layer to elevated pressure and an elevated temperature sufficient to cause parts of the first layer to deform, without melting, to fill respective recesses characterized in that a second layer of material is deposited on the top of the first layer prior to or during the application of temperature and pressure.

It is particularly preferred that the second layer is an anti-reflective coating, because such a coating is required at a later stage in the normal production sequence. This layer may be deposited by sputtering or other suitable technique and may for example be titanium nitride.

Where the first layer is a metal, the second layer may be a oxide or nitride of the first layer. For example, a native oxide may be formed by introducing oxygen or exposing the wafer to atmosphere by means of a "vacuum break". The nitride may be formed by exposing the second layer to nitrogen during the application of high pressure.

The second layer is thin relative to the first layer. For example, if it is an oxide, the layer may be in the range of 15 Å to 25 Å or an anti-reflective coating may be typically be of the order of 100 Å to 500 Å. This contrasts with the layer of thickness, which, for aluminum alloy, may be typically be 2500 Å to 50,000 Å. Usually the first layer will be a metallic electrical conductor such as an aluminum alloy, copper or gold. Gold would require a coating such as titanium nitride as it does not readily form oxides or nitrides.

The method may also include depositing a thin layer of material prior to the deposition of the first layer to form a barrier or lubricating layer. This may be titanium nitride or indeed a prior layer of the material of the first layer. This may be titanium nitride or indeed a prior layer of the material of the first layer.

The invention of GB '461 also includes devices formed using such a process.

Thus, as described above, in our earlier co-pending European Patent Application No. 92304633.8 (EP '633) and British Patent Application No. 9619461.8 (GB '461) (the contents of which are incorporated herein by reference) we describe improvements to a method of at least partially filling recesses on the surface by means of the application of temperature and pressure. Other methods involve drifting molten metal into the recesses, e.g. by surface diffusion.

One of the main applications for such techniques is for the depositions of an interconnect layer that typically consists of several elements of which the main elements are:

(i) A barrier layer. This is frequently of Titanium or Titanium alloy and its purpose is generally to provide good adhesion to the surface layer and to avoid unintentional or undesirable alloying between the connection layer and the surface layer, in particular to avoid Aluminum alloy "spiking" through a contact junction.

(ii) A main conducting layer which is typically of Aluminum alloy. It is this layer that forms the bulk of the combined structure and the process revealed in the above-mentioned Applications describe how it is forced into recesses on the surface of the wafer by the application of heat and pressure such as to substantially fill the recesses.

(iii) A top layer of Anti-Reflection coating to aid subsequent lithographic steps.

It should be understood that any or all of these elements can be deposited in separate pieces of equipment and the wafer is exposed to atmosphere as it is moved to the next. However, exposure to atmosphere causes the exposed surface of the wafer (e.g. the barrier layer) to be modified e.g. by the formation of oxides. This may be considered desirable as in the case TiN, it seems to enhance the 'barrier' qualities of the layer.

However, it has been found that the recess filling process disclosed in the co-pending Applications has failed to work reliably unless exposure of the TiN barrier layer to atmosphere is avoided or is negated.

SUMMARY OF THE INVENTION

The present invention consists in a method of filling recesses in a surface layer of a workpiece (e.g. a semiconductor wafer) with a conductive material including the steps of: forming a barrier layer on the surface; depositing a layer of conductive material on the surface; depositing a layer of conductive material on to the barrier layer; and forcing and/or flowing the conductive layer into the recesses, characterized in that the barrier layer includes Oxygen or is oxidized and oxidized material in the surface layer is nitrided prior to the deposition of the conductive layer.

For convenience, in this specification, the step set out in the characterizing clause above will, on occasions, be referred to as "reactivation".

BRIEF DESCRIPTION OF THE DRAWINGS

An embodiment of the present invention will now be described in detail, by way of example, with reference to the accompanying drawings, in which.

DETAILED DESCRIPTION OF THE PREFERRED EMBODIMENTS

Figure 1:
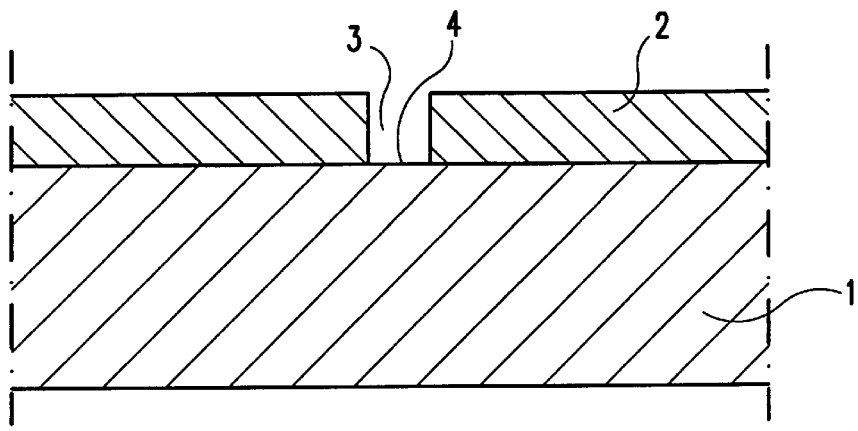
FIG. 1 shows a cross-section of a semiconductor wafer prior to the formation of a layer according to the EP '633 invention.

The EP '633 invention will first be described in greater detail with reference to FIGS. 1–7. FIG. 1 shows a semiconductor wafer 1 with a pre-existing layer 2 thereon. The wafer 1 itself may contain a plurality of layers and/or regions of different properties, to form a semiconductor device, and will be the result of a fabrication process involving a plurality of stages for forming those layers and/or regions. The internal structure of the wafer 1 is not of significance in the EP '633 invention, and therefore these layers and/or regions will not be discussed further.

The layer 2 has a hole or trench structure 3 therein, and the present invention is concerned with the problem of forming a layer over the pre-existing layer 2, e.g. so that either an electrical contact can be made by a metal layer to the surface 4 of the wafer 1 within the hole or trench structure 3, or an electrical insulator can be formed on the surface 4 of the wafer 1 within the hole or trench structure 3, or a layer can be formed that can be made semiconductive in known matter. That surface 4 may thus be in contact with e.g. active regions within the wafer, or further conductive tracks within the structure on the wafer.

Figure 2:
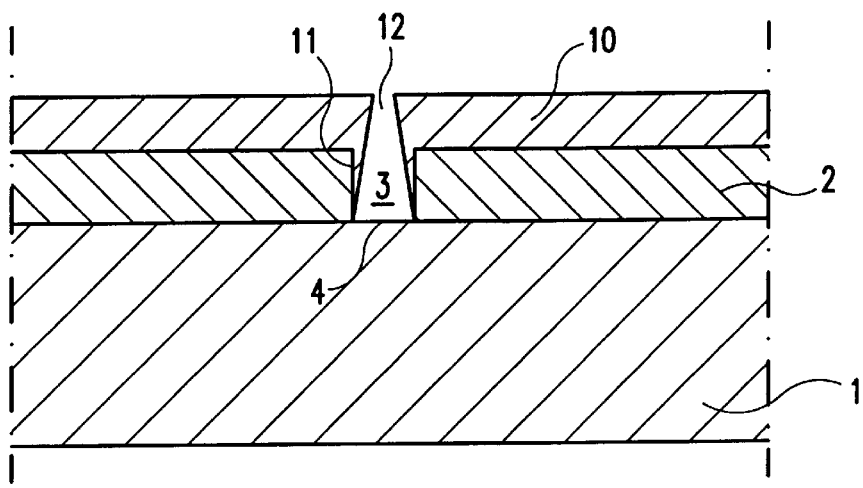
FIG. 2 shows a cross-section of the wafer of FIG. 1, at an intermediate stage in the formation of a layer according to the EP '633 invention.

To form a metal layer, a material such as aluminum is sputtered onto the surface of the layer 2 e.g. in a downward or sideways direction in FIG. 1. Sputtering can also be done upwards if desired. To form an insulating layer, a material such as silicon dioxide is deposited onto the surface of the layer 2 by e.g. chemical vapor deposition. This process continues until the new layer over the pre-existing layer 2 has a suitable thickness. This is shown in FIG. 2, with the new layer shown at 10. With such deposition techniques, deposition of the material to form the layer 10 tends to occur more rapidly at the mouth of the structure 3, as compared with its side walls and its base, formed by surface 4. As a result, as shown in FIG. 2, the side walls 11 of the hole or trench structure 3, and the surface 4, have a relatively thin layer of material thereon, as compared with the layer 10 covering the surface of the pre-existing layer 2. It can thus be seen that satisfactorily reliable electrical connection or insulation to the wafer 1 at the surface 4 may not be achieved. Furthermore, it is not normally possible to increase the amount of deposition on the side walls 11 and the surface 4 by continuing the deposition process, because that deposition process will eventually close the gap 12 in the layer 10 above the hole or trench structure 3, preventing further deposition within that structure and leaving a void.

The technique described above represents the currently standard method, and the poor coverage to the surface 4 may thus become a defect or weak point in the device.

Figure 3:
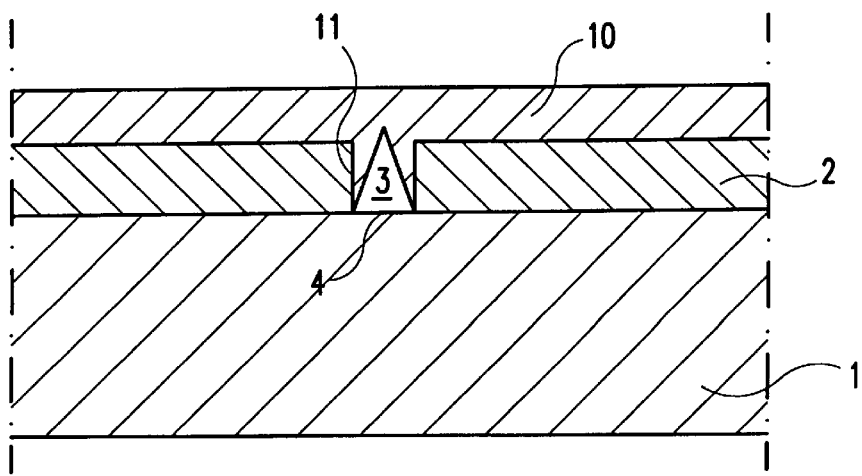
FIG. 3 shows a cross-sectional view of the wafer, after the layer has been completed.

It is important that deposition should close the mouth of the structure. In some case, this may require more thickness than required elsewhere to be deposited, in which case excess material can be removed by etching, after the structure has been filled. FIG. 3 thus shows a processing stage similar to FIG. 2, but in which the mouth of the structure is closed, to have a void below the layer 10. This idea of wholly sealing the void may also be achieved by providing a capping layer over the layer which thus may seal any open voids. Such a capping layer may also improve the configuration of the final surface. Such a capping layer may also improve the configuration of the final surface. Such a capping layer may be any suitable material, and may have a higher Youngs modulus than the layer being capped at the temperature/pressure at which it is to deform. After the wafer has been subject to the elevated temperature/pressure conditions, the capping layer may be removed or may be left in place depending on the material of that capping layer.

Figure 4:
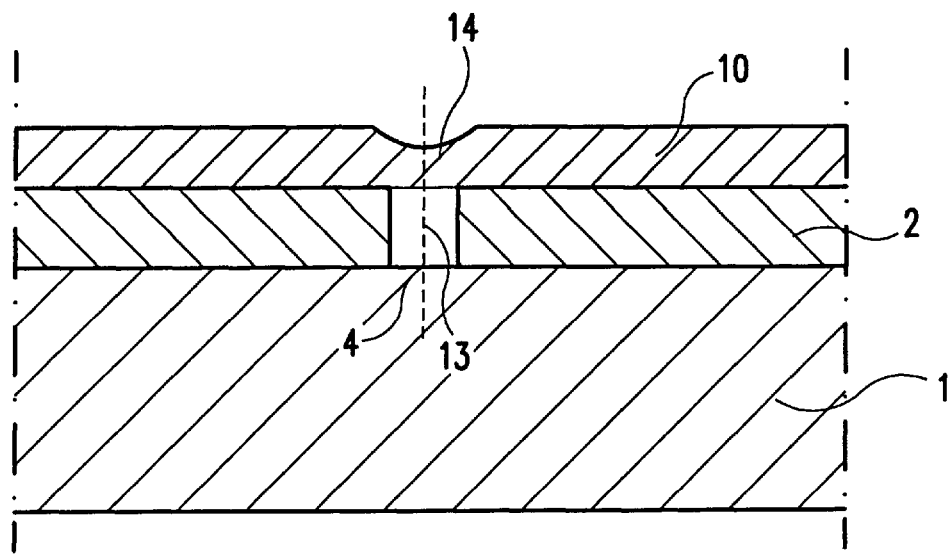
FIG. 4 shows a cross-sectional view of the wafer, after exposure to elevated pressure and elevated temperature.

Therefore, according to the EP '633 invention, once the stage of FIG. 3 has been reached, further deposition of the material ceases, and the structure shown in FIG. 3 is then subjected to the elevated temperature and pressure, e.g. temperatures above 350° C. to 400° C. and pressure above $20 \times 10^6$ Pa (3,000 p.s.i.), assuming that the material of the layer 10 is aluminum. Such elevated temperature and pressure causes the material of layer 10 to flow proximate the structure 3, and this process may continue until the structure 3 is filled, as shown in FIG. 4. Material 13 then entirely fills the structure 3 and thus satisfactory electrical contact to, or insulation of, the surface 4 may then be achieved. There may be a small depression 14 in the layer 10 above the structure 3, due to the flow of material 13 into the structure 3 to fill it, but this depression does not affect the electrical properties of the device.

In this way, a satisfactory contact or insulation can be achieved, and it is found that this method is not affected by the width of the structure.

Figure 5:
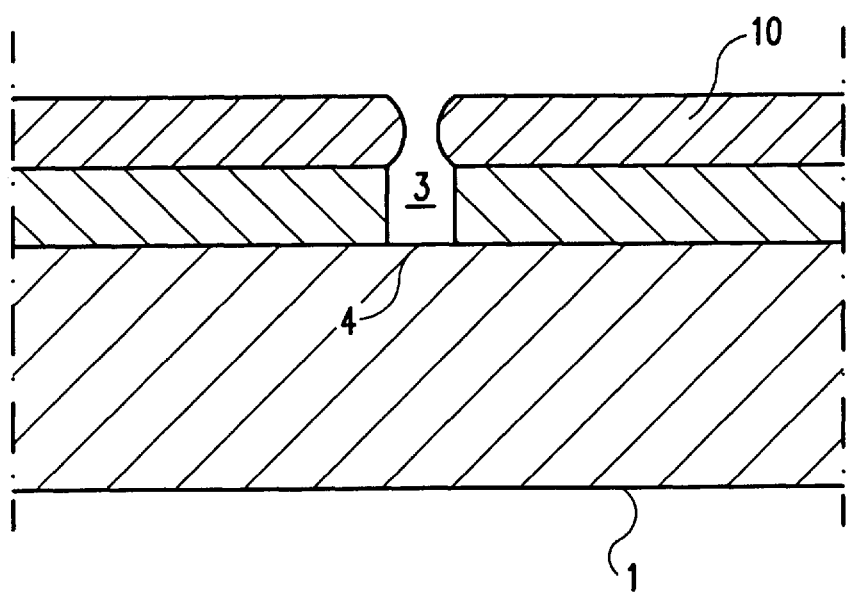
FIG. 5 is a sectional view corresponding to FIG. 2, but for higher temperatures.

As has previously been mentioned, it is important for the layer 10 wholly to cover the hole or trench structure 3, so that the void is sealed. This closing of the mouth of the structure 3 enables the material to be pushed down into the structure 3, because of the pressure differential across the layer 10 at the site of the structure 3. Therefore, there is little advantage to be gained by depositing material within the structure 3, as shown in FIGS. 2 and 3. Although the arrangement described with respect to FIGS. 2 and 3 assumes that a relatively thin layer of material is deposited on the side walls 11 of the structure 3, and the surface 4, such deposition retards closing the mouth of the structure 3, thereby increasing the thickness of the layer 10 which needs to be deposited in order to close that mouth. However, it has been found if deposition occurs at elevated temperatures, e.g. 400° C. to 450° C., the shape of the layer 10 adjacent the structure 3, before the mouth of the structure 3 is closed, may be different, as shown in FIG. 5. Deposition occurs preferentially at the mouth of the structure 3, thereby speeding up the closing of the mouth of that structure 3. Thus, it is preferable that the layer 10 is deposited at elevated temperatures. For deposition at lower temperatures, the thickness of the layer 10 is normally at least 2 times the width of the structure 3, but this limit may be avoided by use of elevated temperatures as described above.

It should further be noted that it is important that the structure 3 must be wholly filled by the material 13, as shown in FIG. 4. If the pressures are not sufficiently high, or are not maintained for sufficiently long, the flow of material 13 into the structure 3 may not wholly fill it, and consideration must be given to this during the carrying out of the EP '633 invention. It may also be desirable to form a barrier layer (not shown) between the layer 2 and the layer 10. Furthermore, care needs to be taken if there are a multiplicity of adjacent structures 3, to ensure that there is sufficient material in the layer 10 to fill them all.

Figure 6:
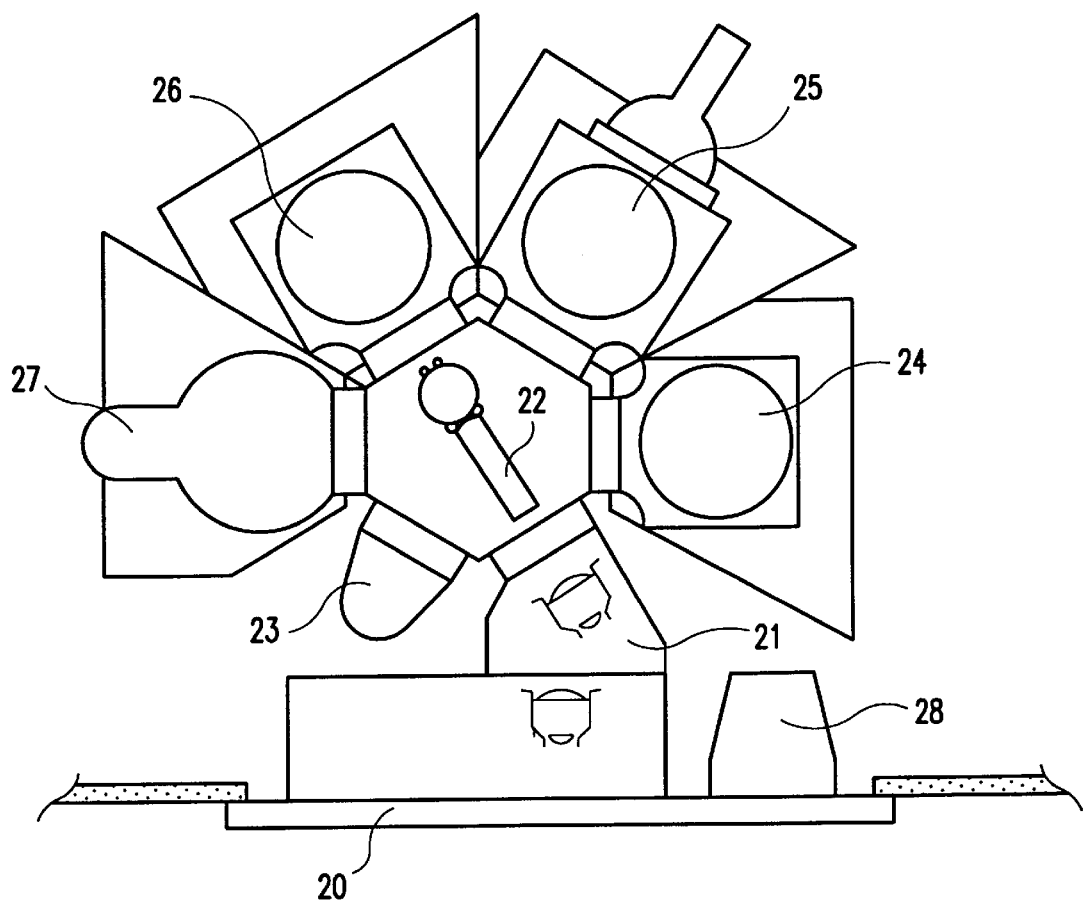
FIG. 6 is a schematic plan view of an apparatus for carrying out the EP '633 invention.

An apparatus for carrying out the EP '633 invention, when the article is a semiconductor wafer, is shown in FIG. 6. The majority of components of that apparatus are conventional, with the exception of the parts for subjecting the article (wafer) to elevated pressures and temperatures.

Thus, semiconductor wafers are loaded into the apparatus via an interface 20, from which interface 20 the wafers are transferred individually to a lock chamber 21. That lock chamber 21 acts as a seal between the interior of the apparatus, in which the wafer is processed, and the exterior. A transport arm 22, receives a wafer from the lock chamber 21 and transports the wafer successively to one of a series of modules, in which processing of the wafer occurs. Normally, the wafer is pre-heated in a pre-heat module 23. The pre-heating of the wafer, in vacuum, ensures that the wafer is fully out-gased, and temperature of approximately 400° C. are maintained for 60 s. For some hydroscopic wafers, a prolonged heating may be necessary.

From the pre-heat module 23, the wafer may be transported by suitable movement and rotation of the transport arm 22, to a sputter etch module 24. This cleans out native oxide from the wafer, and may also further degas the wafer. Such sputter etching is optional.

The processing thus carried out causes, the wafer to be in the state shown in FIG. 1. If, as previously described, a barrier layer is to be formed on the layer 2 before the formation of the layer 10, the wafer is transported to a barrier deposition module 25 either directly from the pre-heat module 23 or from the sputter etch module 24. The barrier layer may be formed in a conventional manner, and may be e.g. of Ti-TiN. The TiN may be deposited by reactive sputtering of pure Ti, and R.F. bias, in-situ oxygen incorporation, or vacuum breaks can be used to increase the integrity of the barrier layer, if formed, is of the order of 100 nm. It should be noted that formation of a barrier layer on the structure shown in FIG. 1 is known.

Then, the wafer is transported by the transporter arm 22 to a deposition module 26, in which the layer 10 is deposited. Such deposition may be by known methods, and sputter deposition is preferred. As has previously been mentioned, it is preferable for such deposition to occur at elevated temperatures. The deposition of the layer 10 continues until all hole or trench structures on the article are sealed by the layer 10.

The modules 23 to 26 of the apparatus described above may be conventional. In the conventional arrangement, where a layer 10 is formed, it will not seal the hole or trench structures, but the sealing of such structures may be carried out using a conventional module 26.

Then, according to the EP '633 invention, the wafer is transported from the deposition module 26 to a module 27 in which the wafer is subjected to elevated temperatures and pressures so as to cause the layer 10 to deform so that material 13 fills the hole or trench structures, as shown in FIG. 4. The module 27 is shown in more detail in FIG. 7. FIG. 6 also shows a display 28 by which the operator can monitor the movement of the wafer.

Figure 7:
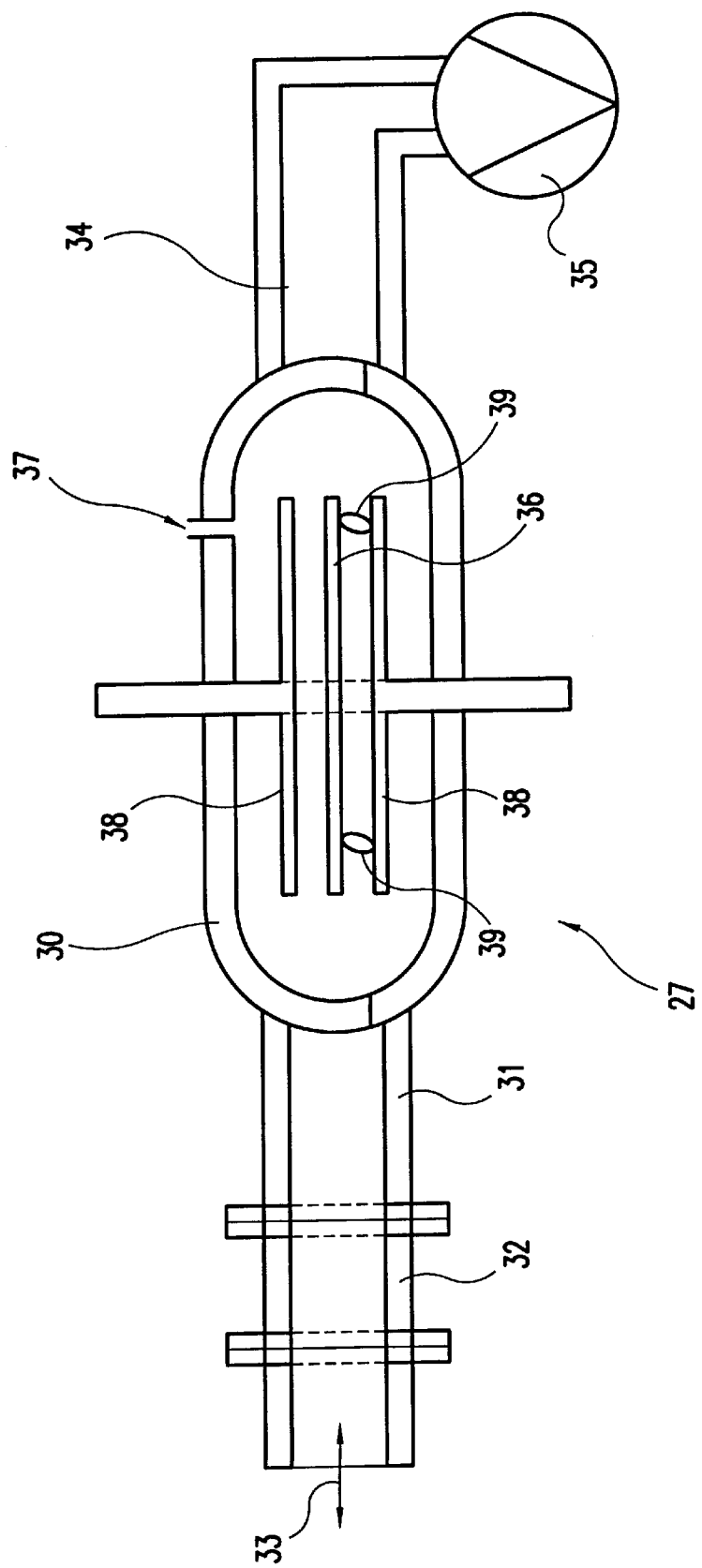
FIG. 7 is a schematic sectional view of the part of the apparatus of FIG. 6, which part subjects the article to elevated pressures and temperatures.

As can be seen from FIG. 7, the module 27 comprises a pressure vessel 30 which is connected via a passageway 31 containing a gate valve 32 to the region of the apparatus containing the transport arm 22. Thus, wafers may be introduced into, and removed from, the pressure vessel 30 via the passageway 31 by opening and closing of gate valve 32, this movement being shown by arrow 33. The interior of the pressure vessel 30 communicates with a vacuum chamber 3 connected to a pump 35. This enables the interior of the pressure vessel 30 to be evacuated. Support pins 39 are provided for supporting a wafer 36 which has been introduced into the pressure vessel 30.

In order to subject the wafer to elevated pressures, the pressure vessel 30 has an inlet 37 connected to e.g. a high pressure Argon source. By filling the interior of the pressure vessel 30 with Argon, the wafer and layers thereon may be subjected to suitably controlled pressures. Furthermore, the pressure vessel 30 contains heating plates 38 which permit the temperature within the pressure vessel 30, and hence the temperature of the wafer to be controlled.

Hence, a wafer 36 introduced into the pressure vessel 30 may be subjected to elevated pressures and temperatures so as to cause a layer 10 formed thereon to form into vias in the wafer.

Thus, although the trend in semiconductor devices is to smaller and smaller dimensions, including smaller dimensions for contact holes, the present invention permits satisfactory electrical contact to be achieved through small contact holes. IN the existing techniques using sputtering, as can be seen from consideration of FIG. 2, deposition at the mouth of the hole would rapidly close a small hole, so that the existing techniques offered only poor electrical contact. With the present invention, on the other hand, the closing of the mouth of the hole during the initial deposition of the metal layer, before the elevated temperature and pressure conditions are applied, may improve the success of contact after those elevated pressure and temperature conditions have been applied.

Also the trend is for the spacing of conductive tracks to become closer and the trenches between them narrower, and the EP '633 invention permits satisfactory electrical insulation to be achieved between layers, by a similar mechanism and with similar advantages.

Figure 8:
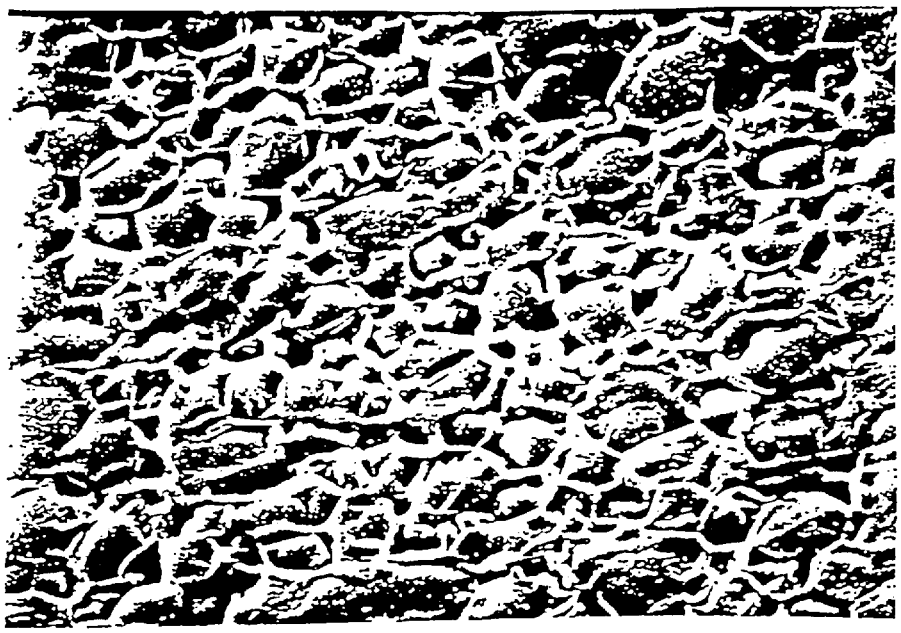
FIG. 8 is a scanning electron micrograph of a wafer processed with anti-reflective coating deposited after the recess filling has taken place.

However, it has been found that when high pressure and heat are applied to force a layer of aluminum or similar material into high aspect ratio recesses or indentations on a semiconductor wafer or the like, the top surface of the layer can, under certain conditions, become rough and the grains structure can appear irregular. This phenomenon becomes more pronounced when there are many recesses in close proximity to each other. FIG. 8 illustrates an example of this.

Figure 9:
FIG. 9 is scanning electron micrograph of wafer processed with the anti-reflective coating deposited prior to the application of high pressure and temperature.
Figure 10:
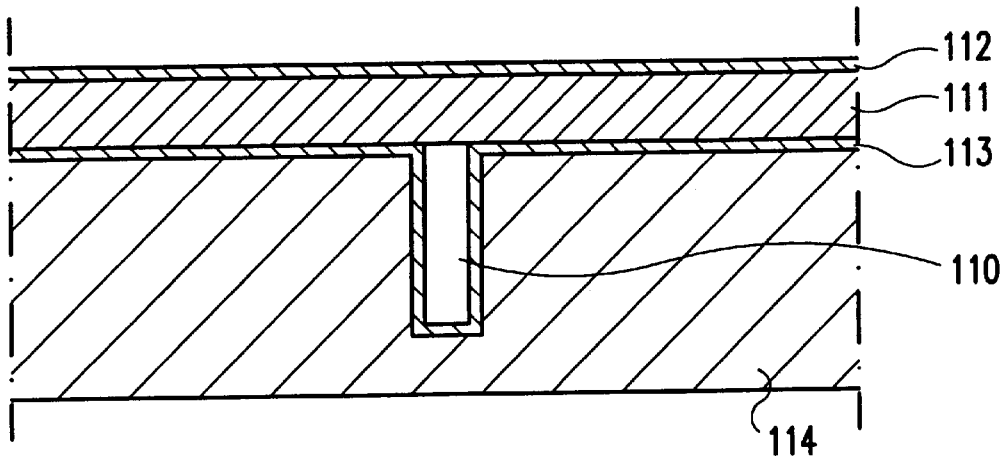
FIG. 10 is a schematic cross-section illustrating a recess prior to the application of elevated pressure and temperature.
Figure 11:
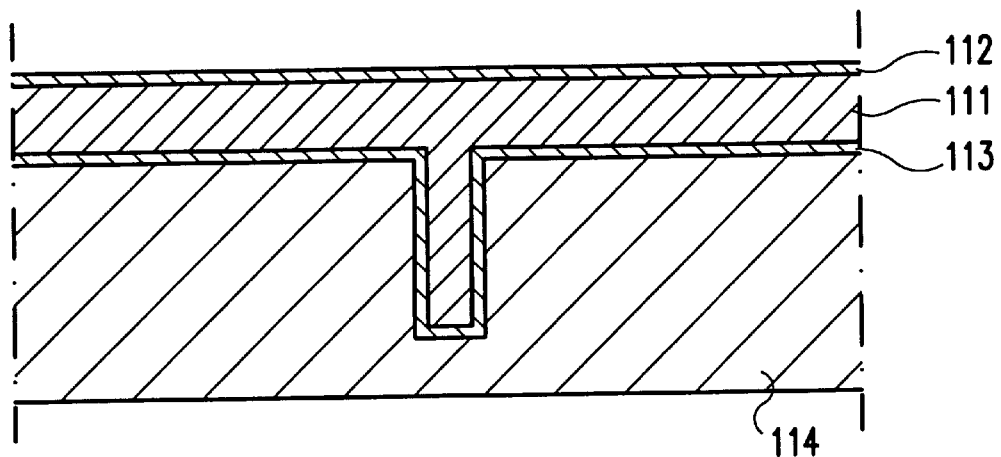
FIG. 11 illustrates the recess after the increase in pressure and temperature.

Referring further to FIGS. 9–11, in the method of the GB '461 invention such recesses 110 are filled by depositing a first layer of material 111 to close completely all the openings of the recesses in the exposed surface to be treated, then depositing a thin second layer 112 on the top of that first layer 111 and subsequently exposing the two layers 112 to elevated pressure and temperature sufficient to cause the first layer to deform, without melting to fill respective recesses 10. FIGS. 10 and 11 illustrate the before and after positions whilst FIG. 9 shows the result of the process of the GB '461 invention and it will be noted that there is a dramatic improvement in the smoothness of the upper surface of the resultant layer and the grain structure is more regular.

It is particularly convenient to form this second thin layer 112 as an anti-reflective coating (eg. Sputter titanium nitride), because such a coating is required subsequently in the processing. However, it has be determined that the layer may also be an oxide or nitride of the material of the first layer. The oxide can be formed by exposing the first layer to oxygen or atmosphere, for example by creating a vacuum break in the processing. A nitride layer can be formed by exposing the layer to nitrogen and this can conveniently be done during the application of high pressure.

Typically the first layer will be a metallic conductor such as aluminum alloy, copper or gold.

It is preferred that barrier layer 113 is deposited on the surface of the workpiece 114, when it is a semiconductor wafer, partly to avoid spiking of gate oxide but partly because it has been discovered that such a barrier layer serves to facilitate the deformation of the first layer into the recesses.

The use of the second layer has been described in GB '461 in connection particularly with the method of EP '633. However, it can also be used with other hole filling systems in which a layer of material is urged into recesses by means of heat and pressure.

The present invention consists in a method of filling recesses in a surface layer of a workpiece (e.g. a semiconductor wafer) with a conductive material including the steps of: forming a barrier layer on the surface; depositing a layer of conductive material on the surface; depositing a layer of conductive material on to the barrier layer; and forcing and/or flowing the conductive layer into the recesses, characterized in that the barrier layer includes Oxygen or is oxidized and oxidized material in the surface layer is nitrided prior to the deposition of the conductive layer.

For convenience, in this specification, the step set out in the characterizing clause above will, on occasions, be referred to as "reactivation".

The barrier layer and the conductive layer can be deposited or formed in any suitable manner and can even be laid down as foil sheets. However, in a preferred embodiment, the barrier layer is formed in a first apparatus and the conductive layer is deposited in a second apparatus. The first apparatus may be chemical vapor deposition (CVD) apparatus, whilst the second apparatus may be physical vapor deposition (PVD) apparatus or electroplating apparatus. The ability to cope with the oxidation, which results from any vacuum break, means that the most preferred apparatus for forming or depositing any layer can be used. The conductive layer may preferably be formed of Aluminum, Aluminum alloy, Copper or silver.

The step of nitriding may be performed with a Nitrogen containing plasma. Additionally or alternatively, the barrier layer may be exposed to plasma-generated atomic Hydrogen in the presence of Nitrogen to nitride any oxidized material in the barrier layer. Alternatively the Oxygen stripping step by atomic Hydrogen and the nitriding step could be performed sequentially. With current apparatus, at least, nitriding in a pure Nitrogen atmosphere is difficult to achieve. The ratio of Hydrogen:Nitrogen may be between 1:10 and 3:1.

The Hydrogen may be supplied in the form of NH$_3$, in which case the NH$_3$ may supply at least some of the nitriding Nitrogen. It is believed that it is the presence of Oxygen that impacts recess filling capability and the thermodynamics of likely contamination chemistry indicates probably mechanisms and suggests solutions that have been found to be effective.

The barrier layer essentially contains atoms of Titanium and Nitrogen however Titanium Nitride forms columnar grain structures that present grain boundaries running from top to bottom. As the Titanium Nitride is acting as a physical barrier this is an inherent defect but it is well known that it can be mitigated by the addition of Oxygen during the formation of Titanium Nitride, or the exposure of Titanium Nitride to Oxygen (e.g. through exposure to air). The Oxygen is said to "stuff" the grain boundaries.

It is thus preferential to have Oxygen additions to the Titanium nitride (to improve the barrier quality) however this presents a problem if the top surface contains some atomic Oxygen. Titanium and Nitrogen stably bond to form a TiN lattice. The subsequent recess filling process brings Aluminum atoms into contact with the TiN surface. Under typical conditions the Aluminum is unlikely to bond to the top layer of Titanium and Nitrogen and so the Aluminum is unlikely to bond to the top layer of Titanium and Nitrogen and so the Aluminum is free to flow into the recesses.

The effect of Oxygen contamination on TiN is that under typical conditions there will be oxidized surface, which consists of Oxygen atoms bonded to the outer layers of Titanium, which will come into intimate contact with the conductive material and under the typical process conditions, which are required to flow conductive material into recesses, the conductive material is likely to form a chemical bond with the barrier layer thus inhibiting the flow of material. Obviously, the more reactive the conductive material, the more likely is the bond to form.

As has been set out above by the Applicants, it has been found that barrier layers containing Oxygen can be made suitable for subsequent processing by replacing at least the surface Oxygen atoms with Nitrogen.

This has been achieved in a number of ways, in particular the use of Nitrogen and Hydrogen containing plasmas. An explanation of possible mechanisms is as follows.

The use of a Nitrogen containing plasma is probably explained by plasma generated species, possibly ion assisted, effectively nitriding the oxidized barrier surface.

$$TiO_2 + N^* \rightarrow TiN + O_2$$

This reaction is only slightly favourable above 625° C.

The use of plasma—or Ultra Violet-generated atomic Hydrogen is more chemically favourable and does not require ion assistance:

$$TiO_2 + 4H^* \rightarrow 2H_2O + Ti - 485KJ$$

If this reaction is carried out in the presence of Nitrogen, the final barrier layer surface would be simultaneously nitrided.

Figure 12:
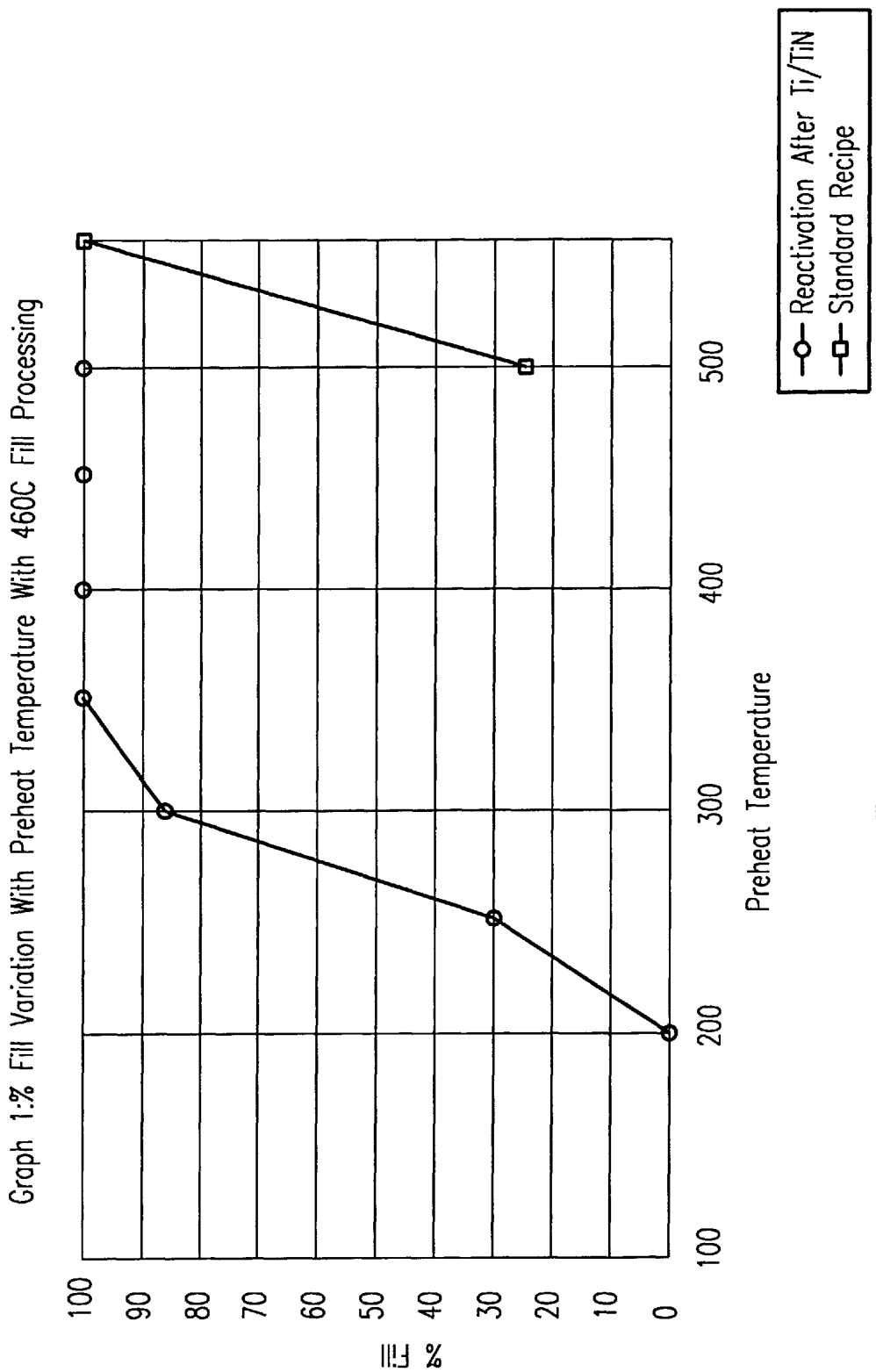
FIG. 12 is a plot of % hole fill against preheat temperature for standard filling and the present invention respectively.

The invention may be performed in various ways and specific embodiments will now be described, with reference to FIG. 12 which is a plot of % hole fill against preheat temperature for standard filling and the present invention respectively.

In the general process described above Chemical Vapor Deposited (CVD) is preferably used because TiN has superior characteristics than Physically Vapor Deposited (PVD) TiN. However, there can be a vacuum break as the wafers are transported from the CVD equipment to the PVD equipment for the metallization processes.

It is found that Aluminum alloys will not flow well into recesses over this TiN material due, it is believed, to a surface oxidation of the TiN. A subsequent PVD TiN layer followed without vacuum break by the Aluminum alloy deposition is an effective solution, but is to be avoided because it leads to the mouths of the recesses being overhung by the subsequent barrier layer, thus inhibiting the filling of the recesses. A plasma process of the following conditions has been found to modify the TiN surface sufficiently to enable good recess filling by the Aluminum alloy.

| | |
|---|---|
| H$_2$/N$_2$ ratio | 1:2 |
| time | 2 minutes |
| typical pressure | 1100 millitorr |
| Plasma Power | 300 watts |

This process yields:

| | |
|---|---|
| recess diameter | 0.5 μm |
| percentage of recesses filled when the barrier layer is treated with a plasma process asa above | 100% |
| without plasma process | 0% |

This process is effective but has not yet been optimized particular for smaller diameter recesses and is given by way of example only. It is believed that changing the ion characteristics, H$_2$/N$_2$ ratio, the Hydrogen source gas (e.g. NH$_3$), pressure temperature and other parameters will achieve 100% recess filling at all recess sizes down to at least 0.35 μm.

Successful processing has also been achieved using the following conditions:

| | |
|---|---|
| Atomic Hydrogen/Nitrogen ratio: | 3:1 |
| Pressure | >100 millitorr (eg. 300–400 millitorr) |
| Applied plasma power | >500 W, 13.56 MHZ (eg. 1.2 KW) |
| Substrate temperature | 400–550 centigrade (eg. 550° C.) |

With NH$_3$ replacing the N$_2$/H$_2$ mixture complete fill of over 95% of 0.35 μm contacts was observed after the subsequent filling step. The process condition in brackets above have achieved 100% for 0.35 μm contacts.

The oxidized Titanium at the surface is re-nitrided in the presence of atomic Hydrogen and atomic Nitrogen either from a mix of gasses or a single gas containing both Nitrogen and Hydrogen (and possibly other elements). The re-nitradation by a mix of atomic Hydrogen and Nitrogen predominately takes place by an initial reduction of the Titanium oxide by the Hydrogen, and then a reaction of the Titanium with the Nitrogen.

Increasing temperatures increases the reaction speed probably by increasing the speed with which the water by-product of the reduction process leaves the substrate surface and so reducing the possibility of reoxidising the surface $$TiN + 2H_2O \rightarrow TiO_2 + \tfrac{1}{2}N_2 + 2H_2$$

At these temperature atomic Hydrogen is thus the enabling reaction as it make available Titanium to react with the Nitrogen. Therefore in a Nitrogen containing ambient atmosphere as atomic Hydrogen concentration is increased from zero the rate of conversion of Titanium Oxide to Nitride increases.

There will naturally come a point where the nitriding of the reduced Titanium Oxide becomes the rate limiting reaction as there are a fixed number of gas molecules in any given volume at constant temperature and pressure.

There is thus an optimum mix of atomic Hydrogen and Nitrogen for this process when carried out at temperatures less than that enabling a direct reaction of Titanium Oxide to Titanium Nitride in the presence of atomic Nitrogen. The use of a gas molecule containing both Hydrogen and Nitrogen may be preferable to a mix of the two separate gases because more Hydrogen and Nitrogen atoms may be present in the fixed volume of gas at the substrate surface being reacted.

By way of example in the same volume, when completely dissociated:

$$N_2 + H_2 \rightarrow 2N + 2H$$

$$NH_3 + NH_3 \rightarrow 2N + 6H$$

Further it is well known that in a plasma a Nitrogen containing gas such as Ammonia may be a much more ready source of atomic Nitrogen than molecular Nitrogen. It is also believed that $NH_3$ as a vapor will "stick" to the substrate more readily than Hydrogen or Nitrogen liberating atomic Nitrogen and Hydrogen under energetic bombardment and thus promoting the required surface reactions.

An experimental result is that increasing molecular Nitrogen and Hydrogen gas concentrations up to 10:1 increases nitridation rates, yet this rate is still below that from the use of Ammonia with its 1:3 Nitrogen to Hydrogen atomic content. This is probably because the atomic Nitrogen generated from the molecular Nitrogen is the rate limiting factor.

It has also been observed that as the concentration of molecular Nitrogen in Hydrogen is increased still further beyond a certain point the rate of nitridation reduces yet is still not at the same rate as that from a compound of Nitrogen and Hydrogen such as Ammonia. A possible explanation is that Titanium Oxide reduction is now the limiting factor. Possibly the molecular Hydrogen has become so diluted in molecular Nitrogen that as atomic Hydrogen is formed it is physically precluded from reacting with the substrate surface as it is not in intimate enough contact with it due to the presence of a large number of (unreacted) Nitrogen molecules.

In addition to the particular purposes to which nitriding is put in the method described above, it is believed that nitriding, for example as described above, a previously oxidized barrier layer, e.g. TiN, will improve the barrier characteristics of the layer.

A further surprising advantage from the treatment of the barrier is that the preheat of the wafers need not be as hot.

Placing a workpiece previously in one gas ambient (e.g. atmosphere) into a vacuum or another gaseous ambient causes the workpiece to "outgas" and gas and vapor leave the surface and enter the vacuum or new gas ambient.

This outgassing is particularly undesirable in plasma processes as they are carried out in a partial vacuum consisting of a reduced pressure gas ambient chosen to be reactive in a specific way, or to be unreactive.

The lower the pressure of the process the more potentially deleterious the outgassing to the process as the outgassing will make up a greater proportion of the total gas present or may make the low pressure unachievable without increasing the vacuum pumping speed or will require increased pumping speed and thus expense.

In particular sputtering processes are carried out using an inert low pressure gas ambient typically argon. The argon gas is ionized in a flow discharge generally by applying a suitable negative voltage to an electrode thus providing a "feedstock" of ions which under the influence of the negative potential impact the electrode surface upon which is placed a target material. Target material is sputtered away by ion impact through the argon plasma ambient and onto the workpiece placed conveniently nearby.

Argon is chosen because it is the most commercially attractive inert gas with a relatively massive ion.

However, if there are any potentially reactive gasses or vapor present in the argon ambient they will also be ionized by the glow discharge, becoming reactive and reacting with the sputtered material, either at the target surface, during the flight through the gas ambient or on another surfaces.

When deliberately chosen this process is known as "reactive sputtering" and is used to sputter such materials as titanium nitride where nitrogen is added to the inert sputtering feedstock. However, when this occurs in an uncontrolled manner, from the presence of water vapor, nitrogen, oxygen and the other constituents of atmosphere, then undesired oxides, nitrides and other materials are deposited or formed on the workpiece by reaction with the target material.

This is particularly undesirable for aluminum and its alloys because it is increases resistivity and any inclusion of oxygen in the aluminum film will decrease the flowing properties of the aluminum into holes during the application of pressure.

Therefore for sputtering processes outgassing is undesirable.

The main source of outgassing is the workpiece themselves as they are continually being placed into the process chamber having previously been in atmosphere or other gas environment (e.g. dry nitrogen). Outgassing is a time consuming process and any speeding up of this process is desirable. Well-known ways of speeding up this process are heat and UV, heating being practically universally employed. The greater the heat the faster the degassing.

However, wafers have a thermal budget and this use by preheating could be advantageously avoided.

What has been found is that wafers processed as set out above require lower preheating temperatures to obtain the same hole filling results. In the experiments so far conducted, the process utilized an ammonia plasma.

It is not known exactly why this result is achieved but it cannot simply be as a result of plasma "conditioning", heating or energetic bombardment of the wafer surface because in all cases the wafers are subjected to an argon (inert) plasma as part of the "sputter etch" process after preheating and prior to sputtering. The ammonia plasma process is in addition to and before the sputter etch process.

Experiment A

A large via chain array was used to establish the process limits. The vias were 0.4 µm wide and 1 µm deep. The different experimental splits were carried out on small wafer samples, processed on thermal oxide carrier wafers. The samples were then sectioned through the via array and analyzed on the SEM. The fill capability of each process was determined by counting the total number of holes with complete hole fill and those which had voided. An average of 80–100 vias were observed per sample. The percentage fill was calculated for each sample.

Results and Conclusion

Preheat temperatures can be reduced from 550° C. to 350° C. if a nitriding step is included after Ti/TiN deposition. These temperatures are the minimum required to achieve 100% hole fill without and with the nitriding step respectively. The drawing shows how the hole fill capability increases with increased preheat temperature and how the nitriding process significantly reduces the minimum temperature required for complete fill. The lower preheat temperature will be more compatible for via processing as explained above. Reducing the process time to 2 minutes from the standard 4 minute contact will also help to improve throughput and reduce the length of time that the wafer is exposed to high temperature.

| Module | Standard Conditions | Reactivation Process Conditions |
|---|---|---|
| Preheat | 1 Torr 550° C., 3 mins | 350° C., 3 mins, 1 Torr |
| With nitriding | N/A | 350° C., 2 mins, 1500 sccm $NH_3$ 1200 W platen power, 560 V DC bias |
| Standard filling | 460° C., 1 min | 460° C., 1 min, 1150 bar inlet, 700 bar chamber |

The above table comparing the minimum process requirements required for Ti via structures.

What is claimed is:

1. A method of filling recesses in a surface layer of a workpiece with conductive material, said method comprising:
   forming a barrier layer on the surface layer, the barrier layer including oxygen atoms bonded to a surface of the barrier layer;
   nitriding the barrier layer to remove the oxygen atoms bonded to the surface of the barrier layer;
   depositing a layer of conductive material on the nitrided barrier layer; and
   forcing, flowing, or drifting a part of said layer of conductive material to fill said recesses,
   wherein said step of nitriding is performed with a Nitrogen containing plasma.

2. A method as claimed in claim 1 wherein the barrier layer is formed in a first apparatus and the conductive layer is deposited in a second apparatus.

3. A method as claimed in claim 2 wherein the first apparatus is Chemical Vapour Deposition (C.V.D.) apparatus.

4. A method as claimed in claim 3 wherein the second apparatus is Physical Vapour Deposition (PVD) apparatus or an electroplating apparatus.

5. A method as claimed in claim 1 wherein the barrier layer is exposed to atomic Hydrogen prior to or simultaneously with the nitriding step.

6. A method as claimed in any one of claim 1 wherein the barrier layer is exposed to plasma or U.V.generated atomic Hydrogen, in the presence of Nitrogen, to nitride any oxidised material in the barrier layer.

7. A method as claimed in claim 6 wherein the Hydrogen:Nitrogen ratio is between 1:20 and 3:1.

8. A method as claimed in claim 6 wherein the Hydrogen is supplied in the form of $NH_3$.

9. A method as claimed in claim 8 wherein $NH_3$ supplies at least some of the nitriding Nitrogen.

10. A method as claimed in claim 1 wherein the surface layer is preheated, subsequent to the forming of the barrier layer.

11. A method as claimed in claim 10 wherein the wafer is pre-heated to approximately 350° C. or below.

12. A method as claimed in claim 1 wherein the conductive material is selected from the group: Aluminium, Aluminium alloy, Copper or Silver.

13. A method of filling recesses in a surface layer of a semiconductor substrate with conductive material, said method comprising:
   forming a barrier layer on the surface layer;
   exposing a surface of the barrier layer to oxygen to cause the surface of the barrier layer to oxidize, thereby forming oxygen atoms on the surface of the barrier layer;
   nitriding the barrier layer to remove the oxygen atoms on the surface of the barrier layer;
   depositing a layer of conductive material on the nitrided barrier layer; and
   forcing, flowing, or drifting a part of said layer of conductive material to fill said recesses,
   wherein said step of nitriding is performed with a Nitrogen containing plasma.

14. The method of claim 13, wherein said forming a barrier layer is carried out in a first apparatus, and said depositing a layer of conductive material is carried out in a second apparatus.

15. The method of claim 14, wherein said exposing the barrier layer to oxygen occurs during transporting of the semiconductor substrate from the first apparatus to the second apparatus.

16. The method of claim 13, wherein said forming a barrier layer includes forming a TiN barrier layer.

17. The method of claim 15, wherein said forming a barrier layer includes forming a TiN barrier layer.

18. A method of filling recesses in a surface layer of a workpiece with conductive material, said method comprising:
   forming a barrier layer on the surface layer, the barrier layer including oxygen atoms bonded to a surface of the barrier layer and oxygen atoms below the surface of the barrier layer;
   nitriding the barrier layer to remove the oxygen atoms bonded to the surface of the barrier layer and such that at least some of the oxygen atoms below the surface of the barrier layer remain within the barrier layer;
   depositing a layer of conductive material on the nitrided barrier layer; and
   forcing, flowing or drifting a part of said layer of conductive material to fill said recesses,
   wherein said step of nitriding is performed with a Nitrogen containing plasma.

19. A method of filling recesses in a surface layer of a semiconductor substrate with conductive material, said method comprising:
   forming a barrier layer on the surface layer;
   exposing a surface of the barrier layer to oxygen to cause at least a portion of the barrier layer to oxidize, thereby forming oxygen atoms on the surface of the barrier layer and oxygen atoms below the surface of the barrier layer;
   nitriding the barrier layer to remove the oxygen atoms on the surface of the barrier layer and such that at least some of the oxygen atoms below the surface of the barrier layer remain within the barrier layer;

depositing a layer of conductive material on the nitrided barrier layer; and forcing, flowing or drifting a part of said layer of conductive material to fill said recesses, wherein said step of nitriding is performed with a Nitrogen containing plasma.

20. The method of claim 19, wherein said forming a barrier layer is carried out in a first apparatus, and said depositing a layer of conductive material is carried out in a second apparatus.

21. The method of claim 20, wherein said exposing the barrier layer to oxygen occurs during transporting of the semiconductor substrate from the first apparatus to the second apparatus.

22. The method of claim 20, wherein said forming a barrier layer includes forming a TiN barrier layer.

23. The method of claim 21, wherein said forming a barrier layer includes forming a TiN barrier layer.

* * * * *